: US 7,900,101 B2
(45) Date of Patent: Mar. 1, 2011

(12) United States Patent
Jung

(54) SEMICONDUCTOR MEMORY DEVICE PARALLEL BIT TEST CIRCUITS

(75) Inventor: Dae-Hee Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 191 days.

(21) Appl. No.: 12/389,607

(22) Filed: Feb. 20, 2009

(65) Prior Publication Data

US 2009/0259895 A1 Oct. 15, 2009

(30) Foreign Application Priority Data

Apr. 11, 2008 (KR) ...................... 10-2008-0033475

(51) Int. Cl.
*G11C 29/00* (2006.01)
(52) U.S. Cl. ...................... 714/718; 714/733
(58) Field of Classification Search ................ 365/201, 365/205, 230.06, 189.02; 714/738, 719, 714/718, 733
See application file for complete search history.

(56) References Cited

U.S. PATENT DOCUMENTS

| | | | | |
|---|---|---|---|---|
| 5,646,897 A | * | 7/1997 | Yukutake et al. | 365/205 |
| 5,815,457 A | * | 9/1998 | Pascucci | 365/230.06 |
| 5,870,340 A | * | 2/1999 | Ohsawa | 365/189.02 |
| 6,345,005 B2 | | 2/2002 | Urakami et al. | |
| 6,473,873 B1 | * | 10/2002 | Akamatsu et al. | 714/738 |
| 6,515,923 B1 | * | 2/2003 | Cleeves | 365/201 |
| 6,854,078 B2 | * | 2/2005 | Kinoshita et al. | 714/718 |

FOREIGN PATENT DOCUMENTS

| | | |
|---|---|---|
| KR | 10-2004-0070919 | 8/2004 |
| KR | 10-0524925 | 10/2005 |

\* cited by examiner

*Primary Examiner*—David Ton
(74) *Attorney, Agent, or Firm*—Myers Bigel Sibley & Sajovec

(57) ABSTRACT

Parallel bit test circuits for use in a semiconductor memory devices are provided which include a first bus that has N bus lines that are configured to transfer a first group of N bits of test result data and a second bus that has N bus lines that are configured to transfer a second group of N bits of test result data. These parallel bit test circuits further include a switching unit that has a plurality of unit switches, where each switch is configured to connect a bus line of the first bus and a respective bus line of the second bus in response to a switching control signal that is applied after the second group of N bits of test result data are output from the second bus, to transfer the first group of N bits of test result data from the first bus to the second bus so as to output a total of 2N bits of test result data through the second bus.

18 Claims, 9 Drawing Sheets

SEMICONDUCTOR MEMORY DEVICE PARALLEL BIT TEST CIRCUITS

CROSS-REFERENCE TO RELATED APPLICATION

This application claims priority under 35 U.S.C. §119 from Korean Patent Application No. 10-2008-0033475, filed on Apr. 11, 2008, the contents of which are hereby incorporated by reference in their entirety for all purposes as if fully set forth herein.

BACKGROUND

The present invention relates to semiconductor memory devices and, more particularly, to test circuits for semiconductor memory devices.

Dynamic random access memory ("DRAM") devices are well known in the art and are employed as the primary memory device in many electronic systems. Typically, a unit memory cell (also referred to herein as a "memory cell" or as a "cell") of a DRAM device includes one access transistor and one storage capacitor.

It can be difficult to manufacture all of the memory cells in a memory cell array without defects using conventional semiconductor manufacturing processes. If a memory cell is defective, it cannot be used to store data. Accordingly, semiconductor manufacturers typically include redundancy memory cells in a memory cell array in addition to the normal memory cells. Defective memory cells are then identified through testing operations, and each defective memory cell is replaced with one of the redundancy memory cells.

A parallel bit test is typically used to locate defective memory cells. This test may be performed in an electrical die sorting (EDS) process. Efforts have been made to shorten the time required to perform these tests in order to streamline the manufacturing process and reduce production costs. In fact, prior to development of the parallel bit test, a serial bit test was performed. The parallel bit test ultimately replaced the serial bit test since the parallel bit test requires less time to perform.

A parallel bit test circuit may be used to perform the parallel bit test on a DRAM device. In a parallel bit test mode, the same data is written to N different memory cells, where N is a natural number of 2 or more, and then the stored data is simultaneously read from these N memory cells. The N bits of data that are read are then compared with each other using a comparator to determine whether or not the same data was read from all of the N memory cells. The comparator outputs a bit which indicates whether or not the same value was read from the N memory cells. Thus, using a parallel bit test, the number of cycles that are required to test all of the cells in a memory cell array may be reduced to 1/N.

FIG. 1 is a block diagram of a parallel bit test circuit that is coupled to a memory cell array. As shown in FIG. 1, the parallel bit test circuit includes an input mode selector 10 that selects between a normal mode and a test mode for input data DI. The input mode selector 10 transfers the input data to a memory cell array 20. The memory cell array 20 stores input data which can then be output as output data C1-C4. The parallel test circuit further includes a comparator 30 and an output mode selector 40. The comparator 30 compares the outputs C1-C4 of the memory cell arrays 20 and generates a comparison output signal COM_OUT, and the output mode selector 40 couples either output data or test result data to an output terminal based on the selected mode.

The parallel bit test circuit of FIG. 1 includes two operating modes, namely a normal mode in which data is written to and read from the cells of the respective memory cell arrays 20, and a parallel bit test mode in which data is simultaneously written to and read from each of the memory cell arrays 20.

In the normal mode, one word line within one memory cell array 20 and one or more bit lines that correspond to the memory cell(s) to which data is to be read or written are selected through a combination of row and column addresses. Data can then be read or written to the selected memory cells.

In the test mode, the input mode selector 10 selects the test mode and the same data is written to each of the memory cell arrays 20. A read operation is then performed and the data read from the respective memory cell arrays 20 is applied to the comparator 30. When the data read from the respective memory cell arrays 20 are all 'low' or all 'high', the output COM_OUT of the comparator 30 is at a 'high' level. In all other cases the output COM_OUT of the comparator 30 is at a 'low' level. The result of the comparison COM_OUT is buffered and transferred to the output terminal through the output mode selector 40.

Thus, if identical data is read from all four memory cell arrays 20 when the device is in the test mode, the test result is normal and an output data DQ is output as a logic 'high' level. If instead, any of the data bits read from the four memory cell arrays 20 differ, the output data DQ is output as logic 'low', indicating that at least one of the memory cells in one (or more) of the memory cell arrays 20 is defective.

The parallel bit test circuit of FIG. 1 is employed in semiconductor memory devices such as DRAM devices. FIG. 2 is a high-level circuit diagram of a conventional Synchronous Dynamic Access Memory (SDRAM) Device.

In the exemplary device of FIG. 2, four "banks" are provided that are operated as four memory cell arrays 1200A~1200D. To simplify the diagram, only two of the memory cell arrays, memory cell arrays 1200A and 1200D, are fully depicted. Each memory cell array 1200A~1200D includes a plurality of memory cells that are disposed in rows and columns to form a matrix.

Operation of the memory cell arrays 1200A~1200D (also referred to herein as "memory banks" or simply as "banks") will now be explained with reference to memory cell array 1200A. A word line (not shown in FIG. 2) of memory cell array 1200A is driven according to an output of row decoder ROWDEC 1201A. Word driver 1202A is driven by the output of row decoder ROWDEC 1201A, and the word driver 1202A drives a selected one of a plurality of word lines of the memory cell array 1200A. A data line (not shown in FIG. 2) in memory cell array 1200A is coupled to a sense amplifier 1203A. The sense amplifier 1203A is coupled to a column decoder COLUMN DEC 1205A through an I/O gate circuit I/O GATE 1204A as a column selection circuit. The sense amplifier 1203A is an amplification circuit that detects and amplifies a small potential difference appearing in respective data lines when data is read from a memory cell.

While memory arrays 1200B and 1200C are not fully shown in FIG. 2, it will be understood that they each have a corresponding row decoder 1201B~C, sense amplifier 1203B~C, I/O gate circuit 1204B~C and column decoder 1205B~C. Input lines and output lines of all of the I/O gate circuit 1204A to 1204D for the memory banks are coupled with an output terminal of data input circuit DIN BUFFER 1210 and an input terminal of data output circuit DOUT BUFFER 1211, respectively. Though not limited, terminals D0~D7 become data input/output terminals to receive or output 8 bit data D0-D7.

As is also shown in FIG. 2, an address signal A0~A14 supplied from the address input terminal is first stored at an address register ADD REG 1213. Based on the address signal, a row address signal that selects a memory cell is supplied to the row decoders 1201A~D of each memory bank through a row address multiplexer ROW ADD MUX 1206. Bits A13 and A14 of the address signal select the memory bank, and thus are supplied to a bank control circuit BANK CNL 1212 as a selection signal that selects the memory bank. A column address signal is supplied from the address register ADD REG 1213 to a column address counter COL ADD CNT 1207. A refresh counter REF CNT 1208 generates a row address for an automatic refresh and a row address and a column address for a self-refresh.

In a memory having a capacity of, for example, 256 megabits and in 8 bit as a column address signal, it is effective to A10 of address signals. The column address signal is supplied as preset data to the column address counter 1207, and in a burst mode designated by a command etc. to be mentioned below, the column address signal (either as preset data or as a sequentially incremented value for the column address signal) is applied to column decoder 1205A~1205D of each memory bank.

A control logic block 1209 may include a command decoder COMMAND DEC 12091, a refresh controller REF CONT 12092 and a mode register MODE REG 12093. The mode register 12093 stores operating mode information. Each of the row decoders 1201A to 1201D operates to select a word line when a corresponding memory bank is designated by a bank control circuit 1212. Though not limited, external control signals such as a clock signal CLK, a clock enable signal CKE, a chip selection signal /CS (reference code '/' indicating a row enable signal), a column address strobe signal /CAS, a row address strobe signal /RAS, a write enable signal /WE etc., and address signals passed through DQM and the mode register 12093 may be supplied to the control logic block 1209. The control logic block 1209 produces internal timing signals to control an operating mode of the SDRAM and operation of the circuit blocks based on a change of signal level or timing etc.

FIG. 3 shows the configuration of an exemplary sub array of one of the memory banks shown in FIG. 2. In particular, FIG. 3 is a block diagram of a sub array 1101. Each of the memory banks 1200A~1200D of FIG. 2 would include a plurality of these sub arrays. The row decoder 1200 and the column decoder 1300 for the bank are also shown in FIG. 3. The sub array 1101 comprises sub array areas 1101A and 1101B and plates 11020, 11021, 11030 and 11031. A main word line MWL may be disposed in a row direction of the sub array 1101. A sub word driver SWD is coupled to a main word line and coupled with sub word lines SWL that are provided within the plates 11020, 11021, 11030, 11031. A particular sub word line SWL may be selected by an RAA, RAB signal from RAD driver 1501A, 1501B. Each sub word driver SWD can drive four or eight sub word lines for one main word line.

Each sub array area 1101A, 1101B may include a sense amplifier activation control unit SAA that drives a plurality of bit line sense amplifiers SA, and the above mentioned RAD driver 1501A, 1501B. The sense amplifier activation control unit SAA may supply a control signal Y8A or Y8B to a sense amplifier driver D. The sense amplifier activation control unit SAA may also supply the control signal Y8A or Y8B to the RAD driver. In this manner, the sense amplifier activation control unit SAA can enable a column of plate PLT. This general structure can be repeated within the bank so that the sense amplifier activation control unit SAA can enable all even columns or all odd columns by using control signal Y8A or Y8B.

As shown in FIG. 3, RAD driver 1501A may supply a 4 bit or an 8 bit sub word line selection signal RAA to a column of the sub word line driver SWD adapted in a column of plate to which the plate 11020, 11030 belongs. The RAD driver 1501B may supply a 4 bit or an 8 bit sub word line selection signal RAA to a column of the sub word line driver SWD adapted in a column of plate to which the plate 11021, 11031 belongs.

In a semiconductor memory device having the structure described above with respect to FIGS. 2 and 3, a parallel bit test has been recently developed in which a plurality of data output pins are merged in parallel for producing a common memory test output signal. For example, when data output pins are merged in a unit of four or eight, a pass/fail decision as a test result is obtained through one representative data output pin among the four or eight data output pins. Thus, with this method, when a data bus coupled with data output pins has 64 lines, 64 bit test result data is output, and when a data bus has 32 lines, 32 bit test result data is output.

SUMMARY

Pursuant to some embodiments of the present invention, parallel bit test circuits for use in a semiconductor memory devices are provided which include a first bus that has N bus lines that are configured to transfer a first group of N bits of test result data and a second bus that has N bus lines that are configured to transfer a second group of N bits of test result data. These parallel bit test circuits further include a switching unit that has a plurality of unit switches, where each switch is configured to connect a bus line of the first bus and a respective bus line of the second bus in response to a switching control signal that is applied after the second group of N bits of test result data are output from the second bus, to transfer the first group of N bits of test result data from the first bus to the second bus so as to output a total of 2N bits of test result data through the second bus.

The first group of N bits of test result data may be obtained from a first group of comparison and latch units that are coupled to a first group of memory banks, and the second group of N bits of test result data may be obtained from a second group of comparison and latch units that are coupled to a second group of memory banks that correspond to the first group memory banks. The switching control signal may be activated after a delay of 2-clock cycles in a system clock from a time at which the second group of N bits of test result data is output from the second bus. The parallel bit test circuit may output the 2N bits of test result data during a single read operation cycle.

In some embodiments, the first bus and the second bus each have 32 bus lines. In other embodiments, the first bus and the second bus each have 64 bus lines. The parallel bit test circuit may output 128 bits of test result data at a time during a parallel bit test based on 8 bit lines×16. The semiconductor memory device may be comprised of 8 memory banks and may have a memory cell array structure to output data based on a unit of 128 bits per bank.

According to further embodiments of the present invention, parallel bit test circuits for use in a semiconductor memory device having a split layout structure of near and far input/output sense amplifier units separated on a row decoder within a memory bank are provided. These parallel bit test circuits include a first group of comparison and latch units that are configured to be coupled to a first group of memory banks, the first group of comparison and latch units being configured to compare 4N bits of data that are received from the first group of memory banks and to output a first group of N bits of test result data in response to this comparison. The circuits also include a second group of comparison and latch units that are configured to be coupled to a second group of memory banks, the second group of comparison and latch units being configured to compare 4N bits of data that are received from the second group of memory banks and to output a second group of N bits of test result data in response to this comparison. The circuits also include a first bus having at least N bus lines that are configured to transfer the first group of N bits of test result data and a second bus having at least N bus lines that are configured to transfer the second group of N bits of test result data. Finally, the circuits include a switching unit that has a plurality of unit switches, where each switch is configured to connect a bus line of the first bus to a respective bus line of the second bus in response to a switching control signal that is applied after the second group of N bits of test result data is output from the second bus in order to transfer the first group of N bits of test result data from the first bus to the second bus so as to output a total of 2N bits of test result data through the second bus.

The switching control signal may be activated after a delay corresponding to 2-clock cycle of a system clock from a time point when the input/output sense amplifiers are activated, such that the test result data of N bits is output from the second bus.

The number of bus lines of the first and second buses may be the same, and may be determined as 32 or 64 lines. In the parallel bit test circuit, test result data of 128 bits may be output at a time through a parallel bit test based on 8 bit lines (BL)×16.

The semiconductor memory device according to an embodiment of the invention may have a memory array structure of DDR2 type or DDR3 type.

Pursuant to still further embodiments of the present invention, parallel bit test circuits for use in semiconductor memory devices are provided which include a first group of comparison and latch units that are configured to be coupled to a first group of memory banks of the semiconductor memory device and a first bus that includes N bus lines. These parallel bit test circuits also include a second group of comparison and latch units that are configured to be coupled to a second group of memory banks of the semiconductor memory device and a second bus that includes N bus lines. Both the first and second groups of comparison and latch units each have N output lines which are coupled to corresponding ones one of the bus lines of the first and second buses, respectively. The circuit also includes a switching unit that is configured to connect each of the bus lines of the first bus to a respective one of the bus lines of the second bus in response to a switching control signal.

In some embodiments, the switching control signal is applied after N bits of test result data is output from the second bus to transfer an additional N bits of test result data from the first bus to the second bus. The parallel bit test circuit may also be configured to output 2N bits of test result data per read operation. The switching unit may comprise a plurality of unit switches, where each unit switch is configured to selectively connect a bus line of the first bus to a respective bus line of the second bus.

As described above, data of bits more than twice a predetermined number of bus lines in a parallel bit test can be output, thereby shortening a test time and thus increasing a test efficiency with a cost reduction for a manufacture of semiconductor memory devices.

BRIEF DESCRIPTION OF THE DRAWINGS

The present invention will be more fully understood from the detailed description given hereinbelow and the accompanying drawings which are given by way of illustration only, and thus are not limitative of the present invention. In the drawings.

DETAILED DESCRIPTION OF THE EMBODIMENTS

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather these embodiments are provided so that this disclosure will be thorough and complete, and will fully convey the inventive scope to those skilled in the art. Accordingly, known parallel bit test operations, operation modes for entering a test, operations for writing test data and the configuration and general operation of dynamic random access memory devices and there related functional circuits are not described with respect to some of the embodiments of the present invention.

Unless otherwise defined, all terms (including technical and scientific terms) used herein have the same meaning as commonly understood by one skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Embodiments of the present invention are more fully described below with reference to the accompanying drawings. This invention may, however, be embodied in many different forms and should not be construed as being limited to the embodiments set forth herein; rather, these embodiments are provided so that this disclosure is thorough and complete, and conveys the inventive concept to those skilled in the art.

Parallel bit test circuits for semiconductor memory devices according to certain embodiments of the present invention will now be described with reference to the accompanying drawings. These parallel bit test circuits may provide for reduced test times, and hence may enhance production efficiency.

In a semiconductor memory device having a split layout structure of near and far input/output sense amplifier units separated on a row decoder within a memory bank according to some embodiments of the invention, a switching unit capable of controlling a switching time is adapted to obtain test result data of 2N bits through a bus having N data output lines. As such, twice as many data bits may be output than there are bus lines during a parallel bit test, thereby increasing the speed and efficiency of the test.

Figure 1:
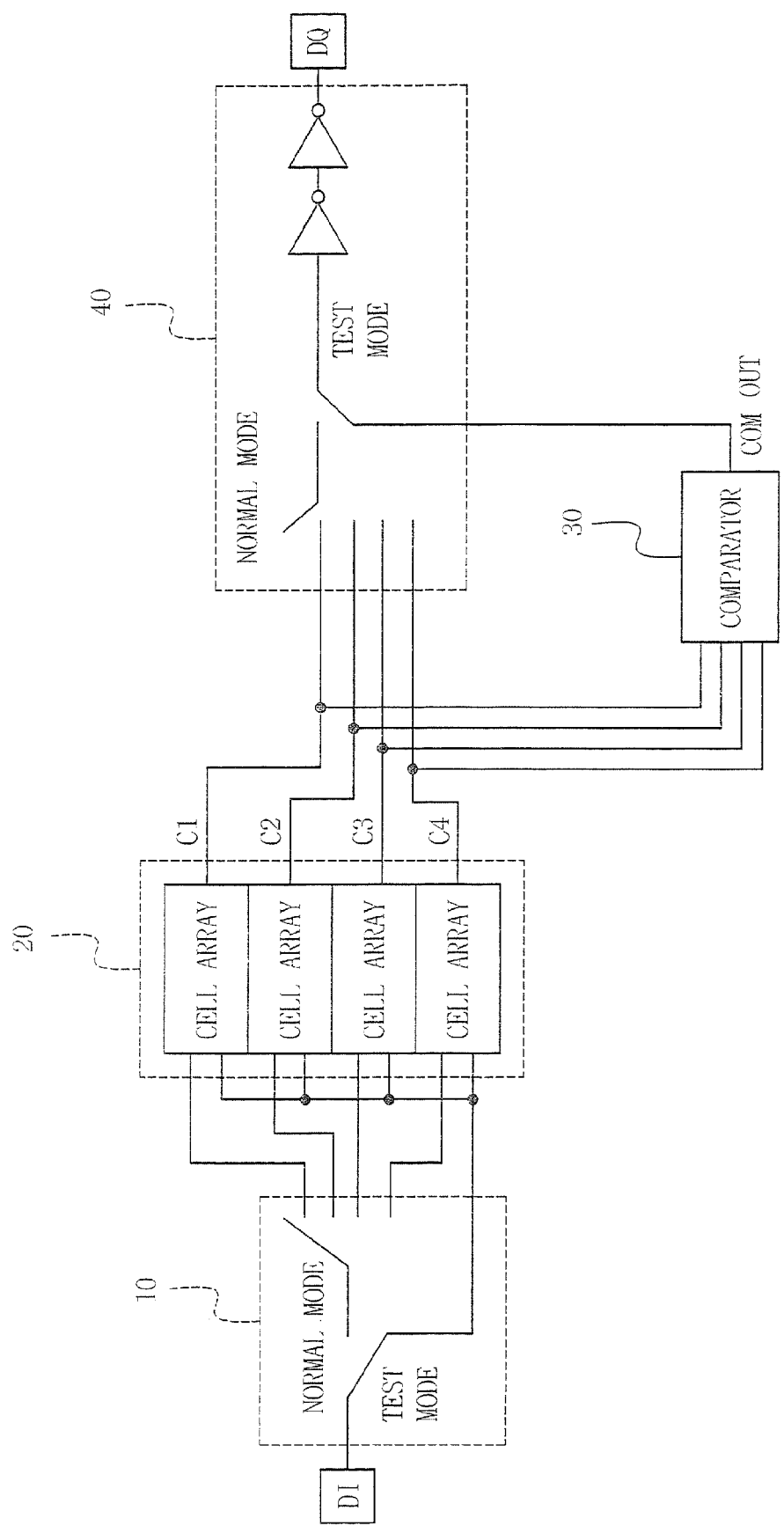
FIG. 1 is a block diagram of a parallel bit test circuit for a semiconductor memory device.
Figure 2:
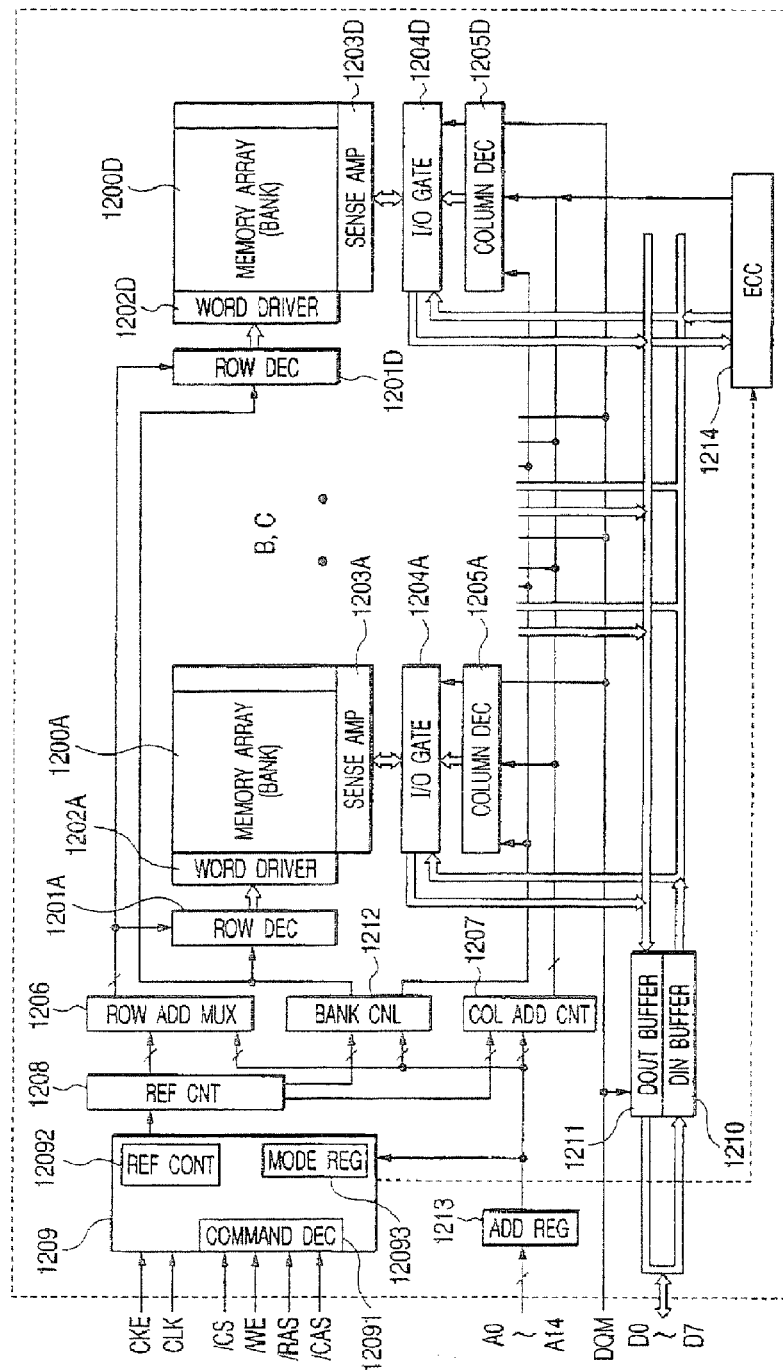
FIG. 2 is a circuit diagram of a semiconductor memory device.
Figure 3:
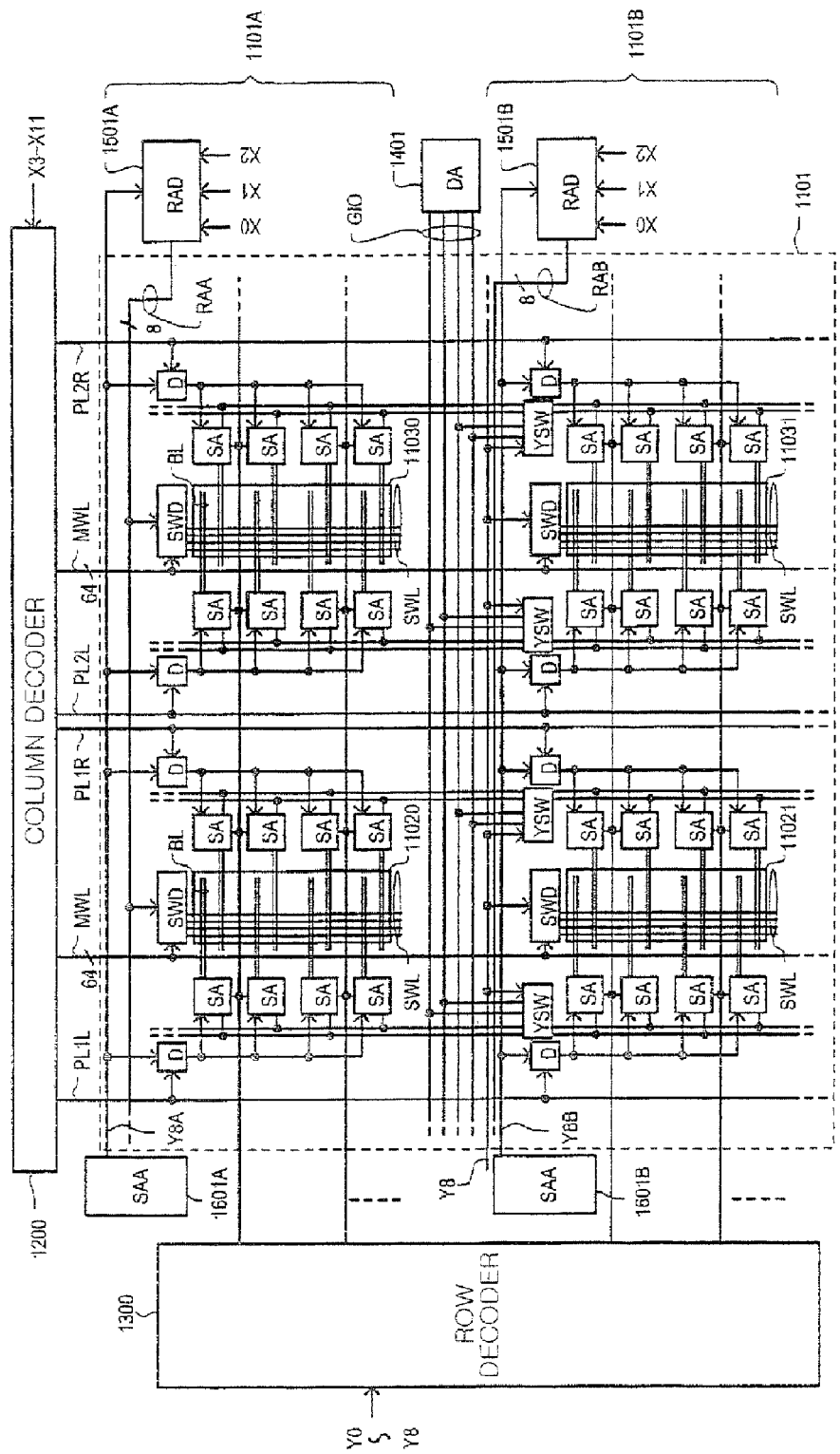
FIG. 3 is a circuit diagram of a sub array constituting a memory bank of the semiconductor memory device referred to in FIG. 2.
Figure 4:
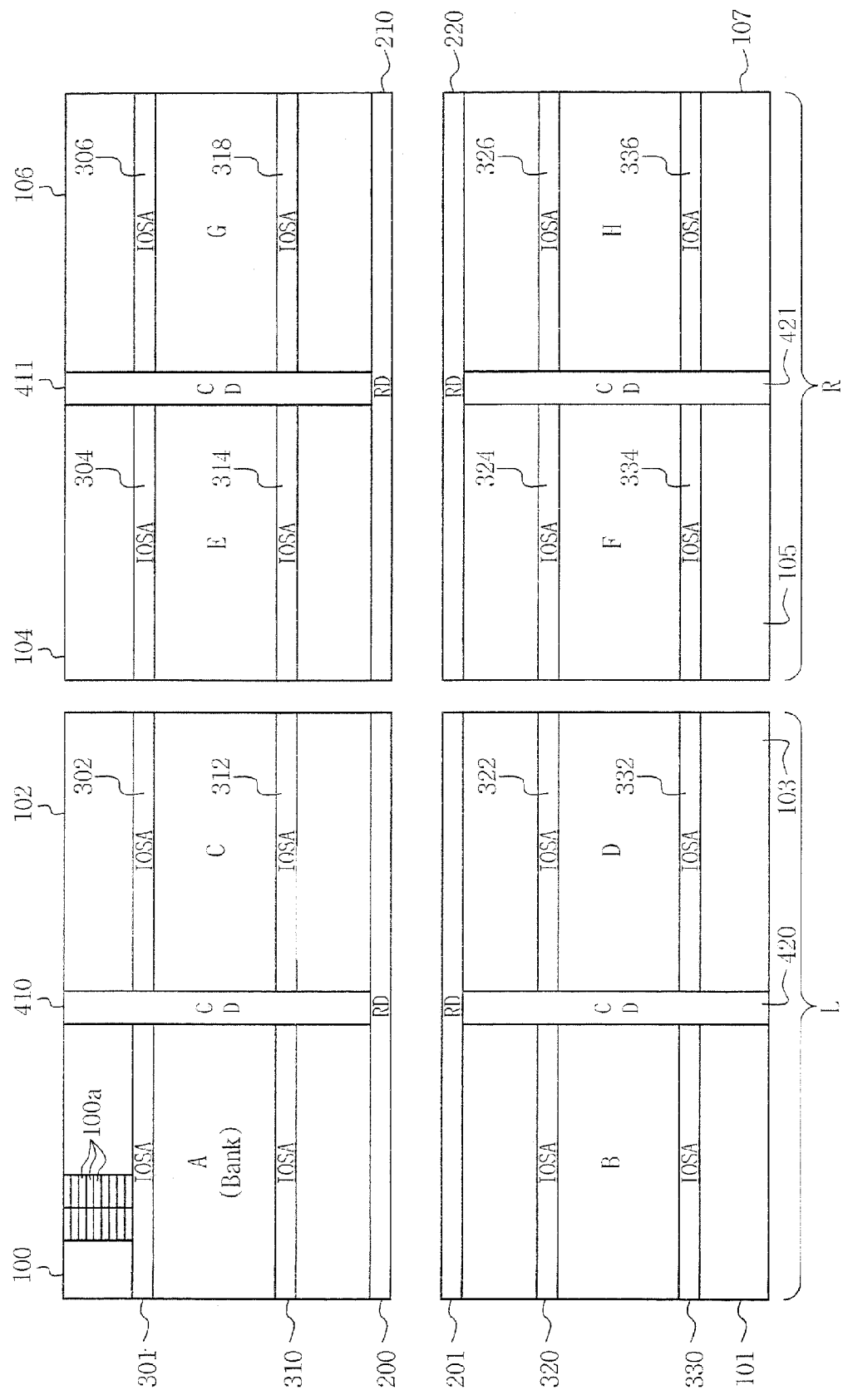
FIG. 4 is a block diagram illustrating the configuration of a memory bank of a semiconductor memory device.

FIG. 4 is a block diagram illustrating the configuration of a memory bank of a semiconductor memory device according to certain embodiments of the present invention. As shown in FIG. 4, the memory cell array is comprised of eight banks 100-107. In applying the memory cell array to DDR3, a capacity of 2 Gbit may be adapted. On the other hand, in DDR2 the memory cell array may be comprised of four banks.

Here, as an example, the four banks 100-103 shown on the left hand side L of FIG. 4 are referred to herein as a "first group of memory banks" and the four banks 104-107 shown on the right hand side R of FIG. 4 are referred to herein as a "second group of memory banks." As shown at the left upper part of FIG. 4, bank A 100 and bank C 102 share a first column decoder 410. Similarly, as shown at the left lower part of FIG. 4, bank B 101 and bank D 103 share a third column decoder 420. As shown at the right upper part of FIG. 4, bank E 104 and bank G 106 share a second column decoder 411, and as shown at the right lower part of FIG. 4, bank F 105 and bank H 107 share a fourth column decoder 421.

In the bank A 100, an input/output sense amplifier unit is divided into two parts so as to have a split layout structure that comprises a near input/output sense amplifier unit 310 and a far input/output sense amplifier unit 301 separated on a row decoder 200 within the memory bank A 100. Similarly, as with the bank A 100, the input/output sense amplifier unit for each of banks B, C, D, E, F, G, H (101-107) is likewise divided into two parts.

A plurality of cell blocks 100a are representatively shown in bank A 100. Each cell block 100a comprises a plurality of memory cells that are arrayed in a matrix of rows and columns, and comprises a sub word line driver coupled individually to sub word lines in a connection structure of four sub word lines coupled to one main word line, and a sense amplifier coupled to a bit line that indicates as a charge amount, data stored in the memory cells, to sense and amplify a potential difference between bit lines.

In DDR3, a data output scheme is 8 bit prefetch, and 128 bits of data per bank are output through the input/output sense amplifier (IOSA) in the structure that the input/output sense amplifier unit is divided and disposed in the bank since 8 column selection lines CSL and two word lines WL per bank are enabled. Thus, in FIG. 4, 512 bits are output from four banks. On the other hand, in DDR2, 64 bits of data are output per bank.

In the parallel bit test, 8 DQ is provided per 1 CSL and its comparison data is assigned each 1 DQ and a read operation is performed. In this case, in the configuration for a wafer parallel bit test (PBT) through x8 bus, an array DQ coding of mixing upper and lower DQs is performed in 1 CSL.

Figure 5:
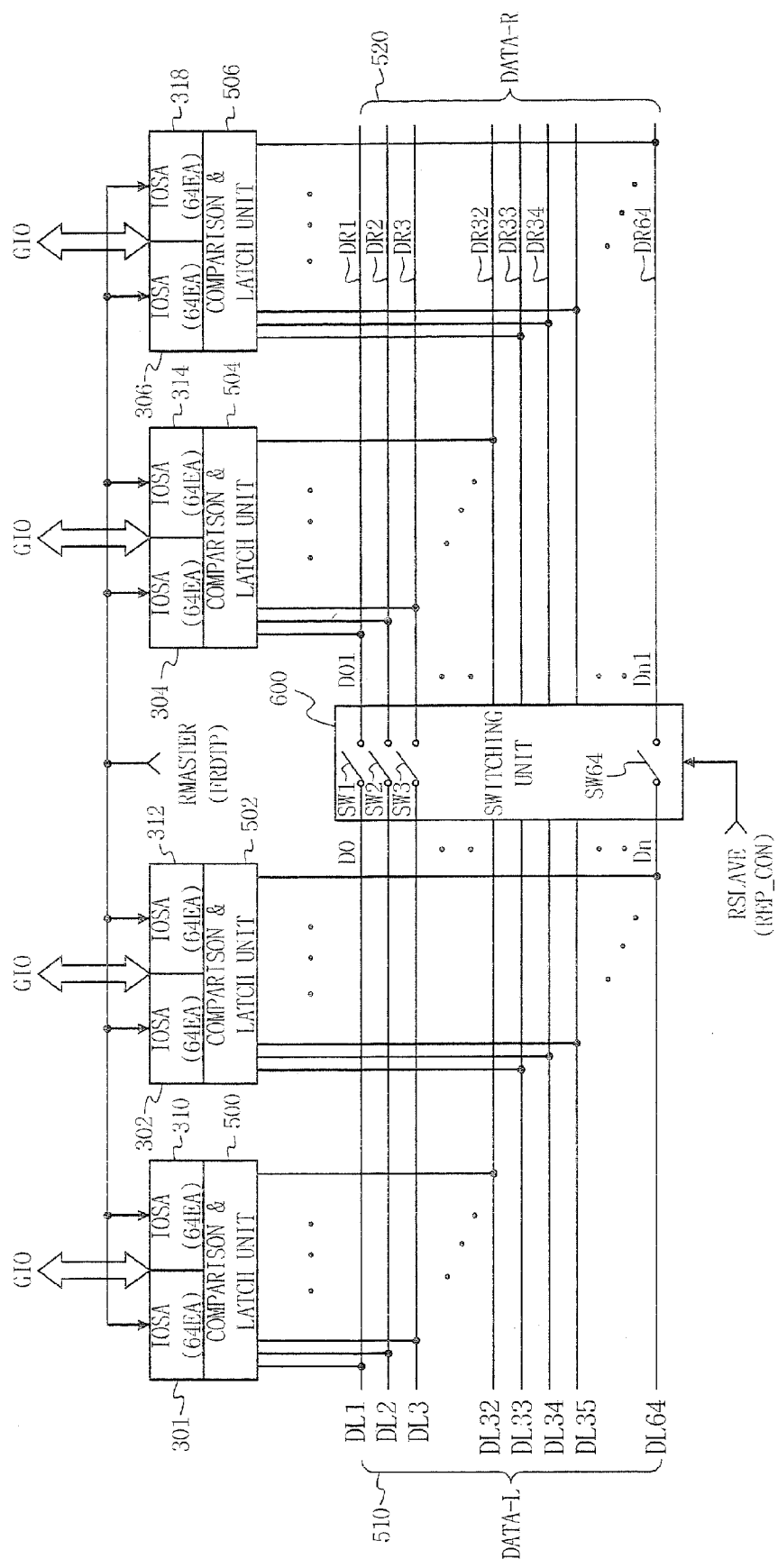
FIG. 5 is a circuit diagram illustrating a parallel bit test circuit according to certain embodiments of the present invention that may be used in the semiconductor memory device of FIG. 4.

FIG. 5 illustrates an example of a parallel bit test circuit according to certain embodiments of the present invention that may be employed in the semiconductor memory device of FIG. 4.

As shown in FIG. 5, four comparison and latch units 500, 502, 504 and 506 are coupled to corresponding input/output sense amplifiers 301, 310, 302, 312, 304, 314, 306 and 318 of FIG. 4. The first comparison and latch unit 500 repeatedly compares 128 bits of data output from the input/output sense amplifiers 301 and 310 that are provided in bank A 100, and then outputs 32 bits of test result data. Here, the 32 bits of test result data is data reduced ¼ from 128 bit data, and thus each bit of test result data is obtained by comparing data output from four input/output sense amplifiers. When the input/output sense amplifiers 301, 310, 302, 312, 304, 314, 306 and 318 are driven simultaneously by a sense amplifier activation signal FRDTP applied as a first output control signal RMASTER, 512 bits of data are simultaneously output from the upper four banks A, C, E and G for one read operation cycle and applied to corresponding comparison and latch units 500, 502, 504, 506. Herein, in an embodiment of the invention, it is assumed that the comparison and latch units 500 and 502 belong to a first group of comparison and latch units and that the comparison and latch units 504 and 506 belong to a second group of comparison and latch units. Comparison and latch units that belong to the first group of comparison and latch units that are coupled to bank B 101 and bank D 103 of FIG. 4 are not shown in FIG. 5 in order to simplify FIG. 5. Similarly, the comparison and latch units that belong to the second group of comparison and latch units that are coupled to bank F 105 and bank H 107 of FIG. 4 are likewise not shown in FIG. 5 in order to simplify the drawing. The comparison and latch units that are coupled to banks B 101 and D 103 of FIG. 4 are disposed symmetrically to the comparison and latch units 500 and 502 on a first bus 510. The comparison and latch units that are coupled to banks F 105 and H 107 of FIG. 4 are disposed symmetrically to the comparison and latch units 504 and 506 on a second bus 520.

The first group of comparison and latch units is coupled with the first group of memory banks, and compares 256 bits of data each output from upper and lower memory banks every cycle, and then respectively outputs 64 bits of test result data.

The second group of comparison and latch units is coupled with the second group of memory banks, and compares 256 bits of data each output from the upper and lower memory banks, every cycle, and then respectively outputs 64 bits test result data.

A switching unit 600 operationally couples the respective bus lines of the first and second buses 510 and 520 in response to a switching control signal REP_CON that is applied as a second output control signal RSLAVE. In particular, the switching unit 600 comprises 64 unit switches SW1-SW64 that are connected between bus lines of the first bus 510 and respective bus lines of the second bus 520. For example, a first switch SW1 of the switching unit 600 couples a first bus line DL1 of the first bus 510 to a first bus line DR1 of the second bus 520. Further, in DDR3, to output 128 bits of test result data through a 64 bit bus, the switching unit 600 performs a connection between bus lines in response to a switching control signal REP_CON that is applied immediately after 64 bits of test result data is output from the second bus 520, to transfer 64 bits of test result data that was loaded in the first bus 510 to the second bus 520.

The first bus 510 transfers the 64 bits of test result data obtained from the first group of comparison and latch units through respective bus lines DL1-DL64. The second bus 520 transfers the 64 bits of test result data obtained from the second group of comparison and latch units through respective bus lines DR1-DR64. The second bus 520 is coupled to a data output terminal that is coupled to an external test device.

The parallel bit test circuit referred to in FIG. 5 is applied to the split layout structure of near input/output sense amplifier unit and far input/output sense amplifier unit separated on a row decoder within a memory bank as shown in FIG. 4.

Figure 6:
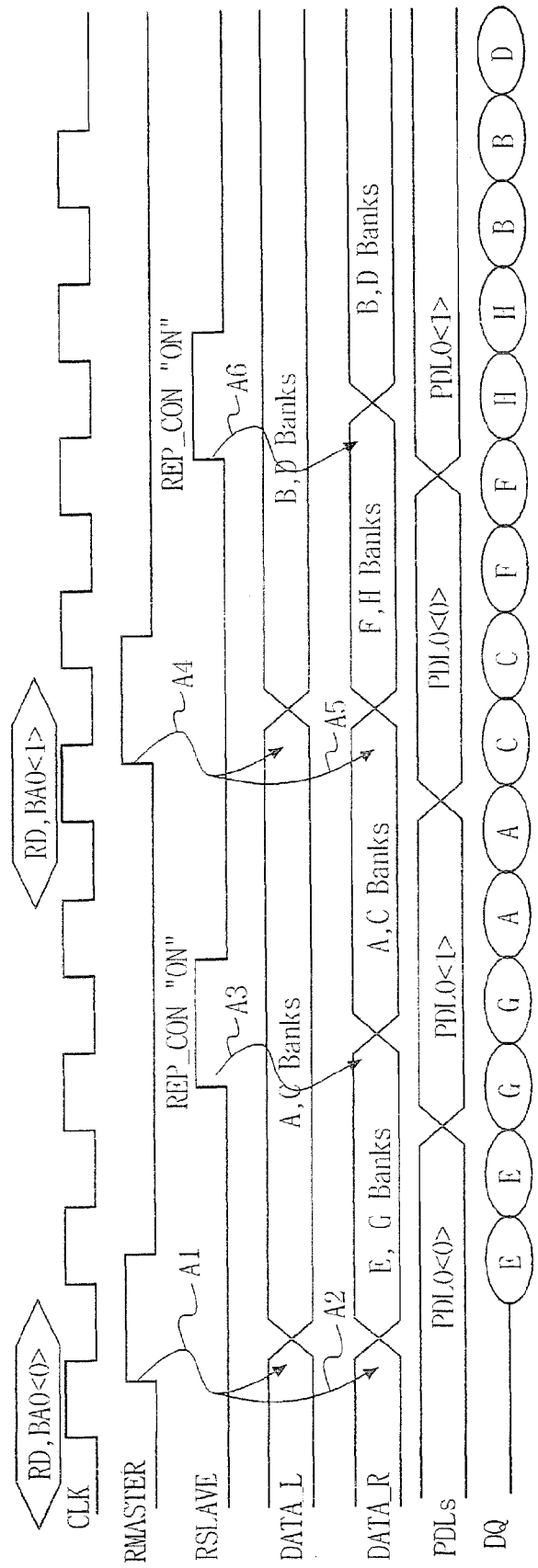
FIG. 6 is a timing diagram illustrating the timing of the data output operations that are described with reference to FIG. 5.

FIG. 6 illustrates the timing of the data output operations that are discussed above with respect to FIG. 5. In FIG. 6, "CLK" refers to a system clock and "RMASTER" is a first output control signal. "RSLAVE" is a second output control signal, and "DATA_L" refers to 64 bit data that is output from memory banks A, C and memory banks B, D. "DATA_R" refers to 64 bit data that is output from memory banks E, G and memory banks F, H. In DDR3, "PDLs" is a data multiplexing signal that is generated inside a memory device as a signal having a given pulse width. "DQ" refers to output data and represents an output sequence of 128 bit data in a unit of x16 at one operating cycle.

In FIG. 6, when a read command and bank address signal (e.g., RD, BAO<0>) selecting the upper memory banks 100, 102, 104 and 106 of the first and second groups of memory banks are applied in a parallel bit test mode, a first output control signal RMASTER that activates input/output sense amplifiers 301, 310, 302, 312, 304, 314, 306, 318 of FIG. 5 is generated in response to the clock signal CLK. The first output control signal RMASTER may be a sense amplifier activation signal FRDTP. When the sense amplifier activation signal FRDTP transitions to a high level, the input/output sense amplifiers 301, 310, 302, 312, 304, 314, 306, 318 are driven simultaneously. As shown by reference numerals A1 and A2 in FIG. 6, when sense amplifiers 301, 310, 302, 312, 304, 314, 306, 318 are driven, a total of 512 bits of data are simultaneously output from the upper four banks A, C, E and G for one read operation cycle. The comparison and latch units 500, 502, 504, 506 each receive 128 bits of data (512 bits total), perform comparison operations, and then each latch unit 500, 502, 504, 506 latches and outputs 32 bits of test result data. Thus, a total of 64 bits of data is output from the second group of comparison and latch units 504, 506 that is coupled to data banks E and G through input/output sense amplifiers 304, 314, 306 and 318. These data bits are output immediately as output DQ through second bus 520. That is, 32 bits of test result data that are based on comparisons of 128 bits of data obtained from data bank E is output through data lines DR1-DR32, and 32 bits of test result data that are based on comparisons of 128 bits of data obtained from data bank G are output through data lines DR33-DR64. Thus, 64 bits of test result data are output from the second bus 520 during the first half of the read operation cycle period.

As is further shown in the timing diagram of FIG. 6, a switching control signal REP_CON is generated, as a second output control signal RSLAVE, later than the first output control signal RMASTER by two cycles of clock signal CLK. When the switching control signal REP_CON is generated, the first and second buses 510 and 520 are connected together to form a single bus. In particular, first switch SW1 of the switching unit 600 couples the first bus line DL1 of the first bus 510 to the first bus line DR1 of the second bus 520, and the rest of the 63 unit-switches likewise couple each bus line of the first bus 510 to its respective bus line of the second bus 520. As a result, 64 bits of test result data that were latched to the first bus 510 are transferred to the second bus 520. This is shown at reference numeral A3 in the timing diagram of FIG. 6. Thus, as shown in the bottom line of FIG. 6, in response to the first read command, test result data DQ is output in units of 16 bits, where the first two units are test result data that is based on bank E, the next two units are test result data that is based on bank G, followed by two units of test result data that is based on bank A, followed by two units of test result data that is based on bank C. Thus, 128 bits of test result data is output through a 64 line bus for one read operation cycle in the parallel bit test mode, thereby reducing the test time in half.

As is also shown in the timing diagram of FIG. 6, when a read command and bank address (e.g., RD, BAO<1>) selecting the lower memory banks 101, 103, 105 and 107 of the first and second groups of memory banks are applied in a parallel bit test mode, first output control signal RMASTER that activates input/output sense amplifiers 320, 330, 322, 332, 324, 334, 326, 336 of FIG. 4 is generated in response to the clock signal CLK. Thus the input/output sense amplifiers 320, 330, 322, 332, 324, 334, 326, 336 are simultaneously driven. As shown by reference numerals A4 and A5 in FIG. 6, when sense amplifiers 320, 330, 322, 332, 324, 334, 326, 336 are driven, a total of 512 bits of data are simultaneously output from the four lower banks B, D, F and H for one read operation cycle. A plurality of additional comparison and latch units (which are not shown in FIG. 5) each receive 128 bits of data (512 bits total), perform comparison operations, and then each latch and output 32 bits of test result data. Thus, a total of 64 bits of data on second bus 520 is immediately output (see "F", "F", "H", "H" in the DQ line of FIG. 6) during the first half of the read operation cycle.

As is further shown in the timing diagram of FIG. 6, a switching control signal REP_CON is generated, as a second output control signal RSLAVE, later than the first output control signal RMASTER by two cycles of clock CLK. When the switching control signal REP_CON is generated, the first and second buses 510 and 520 are connected together to form a single bus. In particular, first switch SW1 of the switching unit 600 couples the first bus line DL1 of the first bus 510 to the first bus line DR1 of the second bus 520, and the rest of the 63 unit-switches likewise couple each bus line of the first bus 510 to its respective bus line of the second bus 520. As a result, 64 bits of test result data that were latched to the first bus 510 are transferred to the second bus 520. This is shown at reference numeral A6 in the timing diagram of FIG. 6. Thus, as shown in the bottom line of FIG. 6, in response to the second read command, test result data DQ is output in units of 16 bits, where the first two units are test result data that is based on bank F, the next two units are test result data that is based on bank H, followed by two units of test result data that is based on bank B, followed by two units of test result data that is based on bank D (the final unit of test result data based on bank D is not shown in FIG. 6). Thus, 128 bits of test result data are output through a 64 line bus for the second read operation cycle in the parallel bit test mode for the lower memory banks, thereby again reducing the test time in half.

Figure 7:
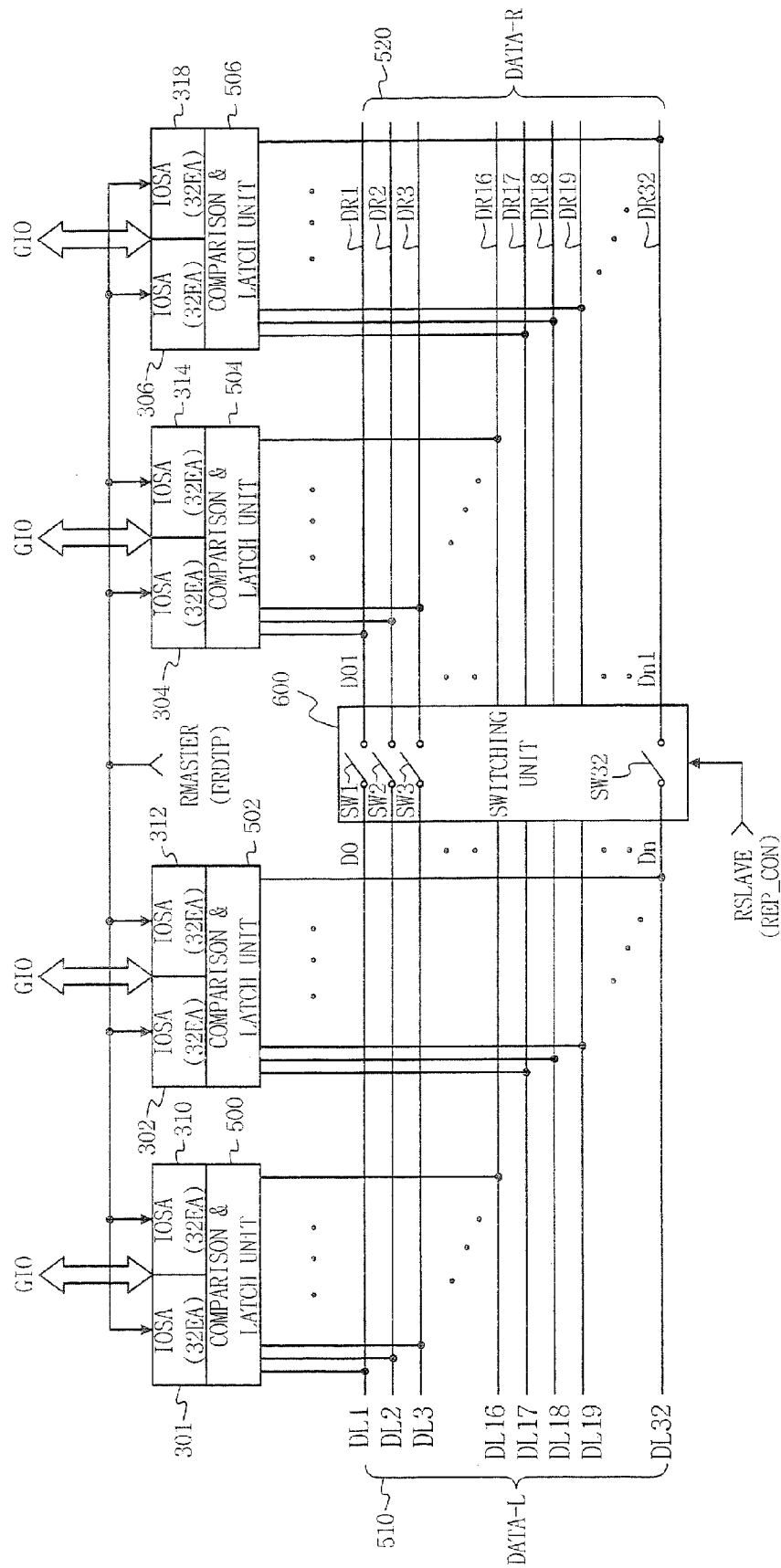
FIG. 7 is a circuit diagram illustrating a parallel bit test circuit according to further embodiments of the present invention that may be used in the semiconductor memory device of FIG. 4.

FIG. 7 illustrates another example of parallel bit test circuit included in the semiconductor memory device of FIG. 4.

As shown in FIG. 7, four comparison and latch units 500, 502, 504 and 506 are coupled to corresponding input/output sense amplifiers 301, 310, 302, 312, 304, 314, 306, 318 of FIG. 4. The first comparison and latch unit 500 repeatedly compares 64 bits of data output from input/output sense amplifiers 301 and 310 that are provided in bank A 100, and then outputs 16 bits of test result data. Here the 16 bits of test result data are data that is reduced by ¼ from 64 bit data, and thus each bit of test result data is obtained by comparing data output from four input/output sense amplifiers. When the input/output sense amplifiers 301, 310, 302, 312, 304, 314, 306 and 318 are driven simultaneously by sense amplifier activation signal FRDTP applied as a first output control signal RMASTER, 256 bits of data are simultaneously output from the upper four banks A, C, E and G for one read operation cycle and applied to corresponding comparison and latch units 500, 502, 504, 506. Note that comparison and latch units that belong to the first group of comparison and latch units that are coupled to bank B 101 and bank D 103 of FIG. 4 are not shown in FIG. 7 in order to simplify FIG. 7. Similarly, the comparison and latch units that belong to the second group of comparison and latch units that are coupled to bank F 105 and to bank H 107 of FIG. 4 are likewise not shown in FIG. 7. The comparison and latch units that are coupled to banks B 101 and D 103 of FIG. 4 are disposed symmetrically to the comparison and latch units 500, 502 on first bus 510, and the comparison and latch units coupled to banks F 105 and H 107 of FIG. 4 are disposed symmetrically to the comparison and latch units 504, 506 on second bus 520.

The first group of comparison and latch units is coupled with the first group of memory banks, and compares 128 bits of data each output from the upper and lower memory banks every cycle, and then respectively outputs 32 bits of test result data.

The second group of comparison and latch units is coupled with the second group of memory banks, and compares 128 bits of data each output from the upper and lower memory banks every cycle, and then respectively outputs 32 bits of test result data.

A switching unit 600 operationally couples the respective bus lines of the first and second buses 510 and 520 in response to a switching control signal REP_CON that is applied as a second output control signal RSLAVE. For example, a first switch SW1 of the switching unit 600 couples a first bus line DL1 of the first bus 510 to a first bus line DR1 of the second bus 520. As a result, the switching unit 600 comprises unit switches SW1-SW32 that are connected between bus lines of the first bus 510 and bus lines of the second bus 520 to perform a connection between the bus lines in response to the switching control signal REP_CON that is applied immediately after 32 bits of test result data is output from the second bus 520, so as to transfer 32 bits of test result data that is stored in the first bus 510 to the second bus 520, to thereby output 64 bits of test result data through the 32 bit bus in DDR2.

The first bus 510 transfers 32 bits of test result data that is obtained from the first group of comparison and latch units through respective bus lines DL1-DL32. The second bus 520 transfers 32 bits of test result data that is obtained from the second group of comparison and latch units through respective bus lines DR1-DR32. The second bus 520 is coupled to a data output terminal that is coupled to an external test device.

Figure 8:
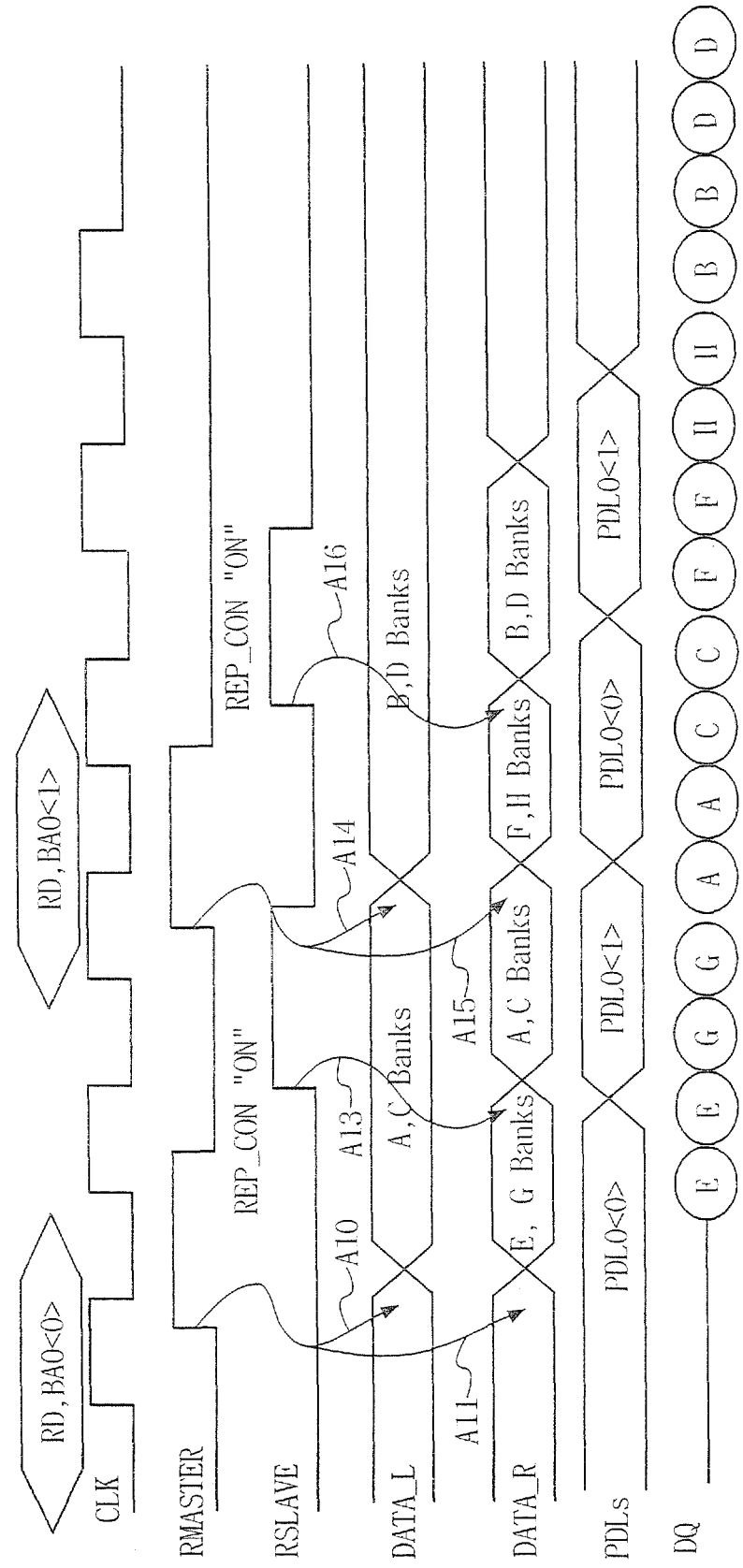
FIG. 8 is a timing diagram illustrating the timing of the data output operations that are described with reference to FIG. 7.

FIG. 8 illustrates the timings of the data output operations referred to above with respect to FIG. 7. In FIG. 8, "CLK" refers to a system clock and "RMASTER" is a first output control signal. "RSLAVE" is a second output control signal, and "DATA_L" refers to 32 bit data that is output from memory banks A, C and memory banks B, D. "DATA_R" refers to 32 bit data that is output from memory banks E, G and memory banks F, H. In DDR2, "PDLs" is a data multiplexing signal that is generated inside a memory device as a signal having a given pulse width. "DQ" refers to output data and represents an output sequence of 64 bit data in a unit of x8 in one operating cycle.

In FIG. 8, when a read command and bank address signal (e.g., RD BAO<0>) selecting the upper memory banks 100, 102, 104 and 106 of the first and second groups of memory banks are applied in the parallel bit test mode, first output control signal RMASTER that activates input/output sense amplifiers 301, 310, 302, 312, 304, 314, 306, 318 of FIG. 7 is generated in response to the clock signal CLK. The first output control signal RMASTER may be a sense amplifier activation signal FRDTP. When the sense amplifier activation signal FRDTP transitions to a high level, the input/output sense amplifiers 301, 310, 302, 312, 304, 314, 306, 318 are driven simultaneously. As shown by reference numerals A10 and A11 in FIG. 8, when sense amplifiers 301, 310, 302, 312, 304, 314, 306, 318 are driven, a total of 256 bits of data are simultaneously output from the four upper banks A, C, E and G for one read operation cycle. The comparison and latch units 500, 502, 504 and 506 each receive 64 bits of data (256 bits total), perform comparison operations, and then latch and output 16 bits of test result data. Thus, a total of 32 bits of data is output from the comparison and latch units 504 and 506 coupled to data banks E and G through input/output sense amplifiers 304, 314, 306 and 318. These data bits are output immediately as output DQ through the second bus 520. That is, 16 bits of test result data that is based on comparisons of 64 bits of data obtained from bank E is output through data lines DR1-DR16, and 16 bits of test result data that is based on comparisons of 64 bits of data obtained from data bank G is output through data lines DR17-DR32. Thus, 32 bits of test result data is output through the second bus 520 during the first half of the read operation cycle period.

As is further shown in the timing diagram of FIG. 8, a switching control signal REP_CON is generated, as a second output control signal RSLAVE, later than the first output control signal RMASTER by two cycles of clock signal CLK. When the switching control signal REP_CON is generated, the first and second buses 510 and 520 are connected together to form a single bus. In particular, first switch SW1 of the switching unit 600 couples the first bus line DL1 of the first bus 510 to the first bus line DR1 of the second bus 520, and the rest of the 31 unit-switches likewise couple each bus line of the first bus 510 to its respective bus line of the second bus 520. As a result, 32 bits of test result data that were latched to the first bus 510 are transferred to the second bus 520. This is shown at reference numeral A13 in the timing diagram of FIG. 8. Thus, as shown in the bottom line of FIG. 8, in response to the command RD, BAO<0>, test result data DQ is output in units of 8 bits, where the first two units are test result data based on bank A, the next two units are test result data based on bank C. Thus, in a parallel bit test mode, 64 bits of test result data is output through a 32 line bus for one read operation cycle.

As is further shown in FIG. 8, when a read command and bank address signal that selects the lower banks 101, 103, 105 and 107 of the first and second group memory banks are applied, a first output control signal RMASTER that activates the input/output sense amplifiers 320, 330, 322, 332, 324, 334, 326, 336 of FIG. 4 is generated in response to the clock signal CLK. Thus, the input/output sense amplifiers 320, 330, 322, 332, 324, 334, 326, 336 are simultaneously driven, and a response operation as shown in reference codes A14 and A15 of FIG. 8 is generated, and 256 bits of data are simultaneously output from the four lower banks B, D, F and H for a one read operation cycle. Each comparison and latch unit for the lower banks (not shown in FIG. 7) receives 64 bits of data (256 bits total), performs comparison operations, and then latches and outputs 16 bits of test result data. Thus, 32 bits of test result data in the second bus 520 is immediately output as "F", "F", "H", "H" for a ½ read operation cycle period as shown in waveform DQ.

As is further shown in the timing diagram of FIG. 8, a switching control signal REP_CON is generated, as a second output control signal RSLAVE, later than the first output control signal RMASTER by two cycles of clock signal CLK. When the switching control signal REP_CON is generated, 32 unit switches of the switching unit 600 couple one-to-one between corresponding bus lines of the first bus 510 and the second bus 520, therefore test result data of 32 bits latched to the second bus 520 are transferred to the second bus 520. Such response operation corresponds to an operation of reference code A16 shown in the timing diagram of FIG. 8, and "B" "B" "D" "D" of each 16 bit unit is output as shown in DQ.

Thus, in a parallel bit test mode for lower memory banks, test result data of 64 bits is output through a 32 line bus for one read operation cycle, thereby reducing relatively by half a test time.

Figure 9:
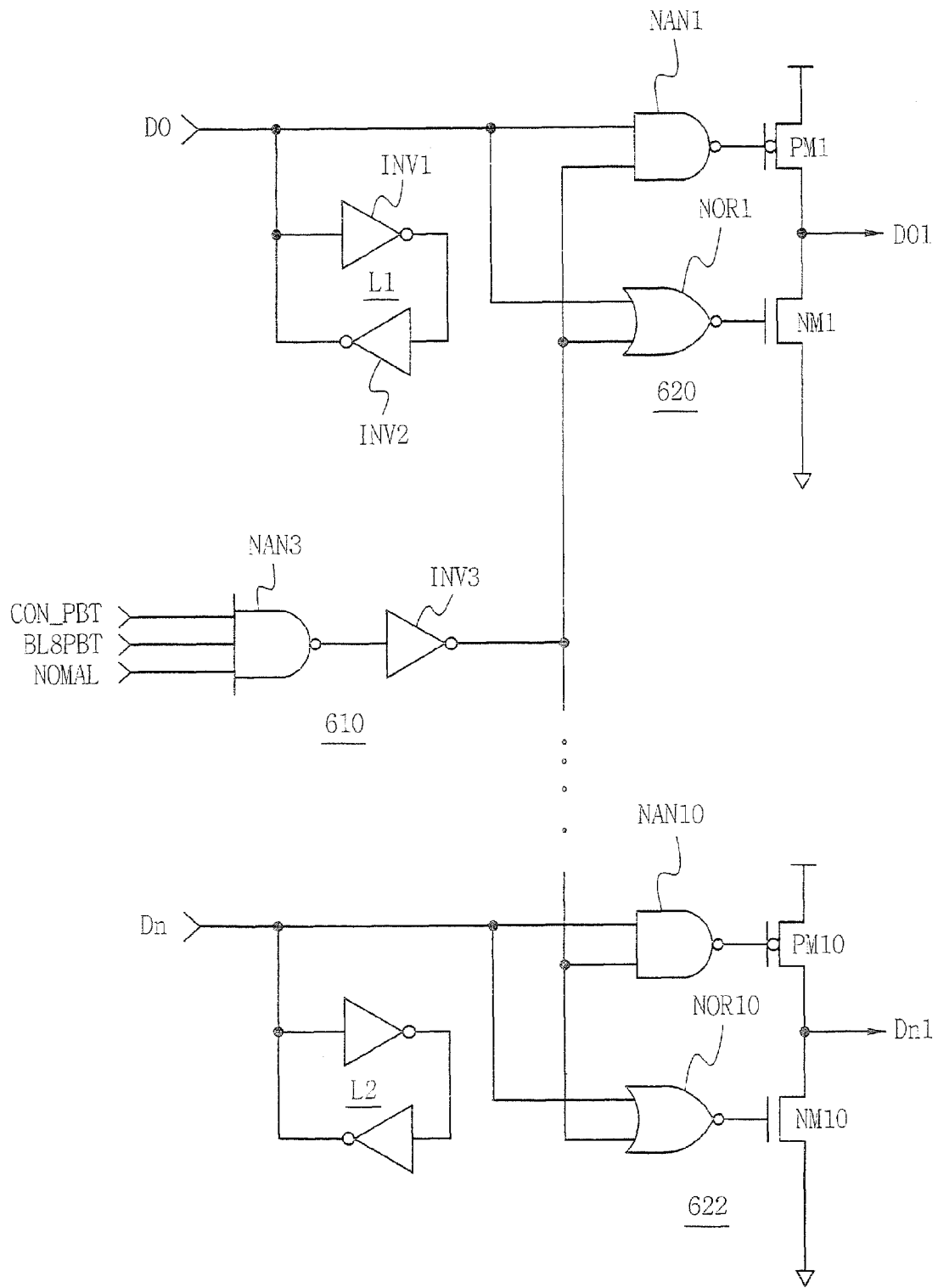
FIG. 9 is a circuit diagram illustrating a switching unit according to certain embodiments of the present invention that may be used in the switching circuits of FIG. 5 and/or 7.

FIG. 9 is a circuit diagram of an example switching unit 600 of FIG. 5 or 7 according to certain embodiments of the present invention. As shown in FIG. 9, the switching unit comprises a control signal generator 610 that generates a drive control signal for a connection between bus lines in response to a switching control signal such as CON_PBT, BL8PBT and NOMAL etc. The switching unit further comprises a plurality of unit switch parts 620 and 622 that are connected between bus lines of the first bus 510 and respective bus lines of the second bus 520. An input terminal of each unit switch part 620 may comprise an inverter latch L1.

The control signal generator 610 comprises a 3-input NAND gate NAN3 and an inverter INV3, and each unit switch part 620 comprises a NAND gate NAN1, a NOR gate NOR1 and P-type and N-type MOS transistors PM1 and NM1. Through the NAND gate NAN1, data of bus line D0 is transferred to bus line DO1 when a high level is applied from the inverter INV3. Through the NOR gate NOR1, data of bus line D0 is transferred to the bus line DO1 when a low level is applied from the inverter INV3.

The CON_PBT, BL8PBT and NOMAL are signals applied as respective high levels in the parallel bit test.

In a parallel bit test circuit for use in a semiconductor memory device according to some embodiments of the invention, the number of data bits output in a parallel bit test may be twice the number of bus lines, thereby shortening the time required to complete the test. Accordingly, the efficiency of the test process may be improved, and/or the manufacturing costs may be reduced.

It will be apparent to those skilled in the art that modifications and variations can be made in the present invention without deviating from the inventive spirit or scope. It is intended that the present invention cover any such modifications and variations of this invention provided they come within the scope of the appended claims and their equivalents. For example, although examples of DDR3, DDR2 have been described above, an inventive technical spirit can be applied to various structures of nonvolatile memories such as DRAM and PRAM etc. Accordingly, these and other changes and modifications are seen to be within the inventive true spirit and scope as defined by the appended claims.

In the drawings and specification, there have been disclosed embodiments of the invention and, although specific terms are employed, they are used in a generic and descriptive sense only and not for limitation, the inventive scope being set forth in the following claims.

What is claimed is:

1. A parallel bit test circuit, comprising:
  a first bus having N first bus lines, the first bus configured to transfer a first group of N bits of test result data through the N first bus lines;
  a second bus having N second bus lines, the second bus configured to transfer a second group of N bits of test result data through the N second bus lines; and
  a switching unit including a plurality of unit switches, wherein each switch is configured to connect a first bus line of the first bus and a respective second bus line of the second bus in response to a switching control signal that is applied after the second group of N bits of test result data are output from the second bus, to transfer the first group of N bits of test result data from the first bus to the second bus so as to output a total of 2N bits of test result data through the second bus.

2. The parallel bit test circuit of claim 1, wherein the first group of N bits of test result data are obtained from a first group of comparison and latch units that are coupled to a first group of memory banks and wherein the second group of N bits of test result data are obtained from a second group of comparison and latch units that are coupled to a second group of memory banks that correspond to the first group memory banks.

3. The parallel bit test circuit of claim 1, wherein the switching control signal is activated after a delay of 2-clock cycles in a system clock from a time at which the second group of N bits of test result data is output from the second bus.

4. The parallel bit test circuit of claim 3, wherein the first bus and the second bus each have 32 bus lines.

5. The parallel bit test circuit of claim 1, wherein the parallel bit test circuit is configured to output the 2N bits of test result data during a single read operation cycle.

6. The parallel bit test circuit of claim 1, wherein the first bus and the second bus each have 64 bus lines.

7. The parallel bit test circuit of claim 1, wherein 2N is 128 in a parallel bit test based on 8 bit lines×16.

8. The parallel bit test circuit of claim 7, wherein the parallel bit test circuit is part of a semiconductor memory that includes 8 memory banks and has a memory cell array structure to output data based on a unit of 128 bits per bank.

9. A parallel bit test circuit for use in a semiconductor memory device having a split layout structure of near and far input/output sense amplifier units separated on a row decoder within a memory bank, the parallel bit test circuit comprising:
  a first group of comparison and latch units that are configured to be coupled to a first group of memory banks of the semiconductor memory device, the first group of comparison and latch units being configured to compare 4N bits of data that are received from the first group of memory banks and to output a first group of N bits of test result data in response to this comparison;
  a first bus having at least N first bus lines that is configured to transfer the first group of N bits of test result data;
  a second group of comparison and latch units that are configured to be coupled to a second group of memory banks of the semiconductor memory device, the second group of comparison and latch units being configured to compare 4N bit data that are received from the second group of memory banks and to output a second group of N bits of test result data in response to this comparison;
  a second bus having at least N second bus lines that is configured to transfer the second group of N bits of test result data; and
  a switching unit including a plurality of unit switches, where each switch is configured to connect a first bus line of the first bus to a respective second bus line of the second bus in response to a switching control signal that is applied after the second group of N bits of test result data is output from the second bus in order to transfer the first group of N bits of test result data from the first bus to the second bus so as to output a total of 2N bits of test result data through the second bus.

10. The parallel bit test circuit of claim 9, wherein the switching control signal is activated after a delay of 2-clock cycles of a system clock from a time at which the second group of N bits of test result data is output from the second bus.

11. The parallel bit test circuit of claim 10, wherein the first and second buses have the same number of bus lines.

12. The parallel bit test circuit of claim 11, wherein the number of bus lines for the first and second buses is 32 or 64 bus lines.

13. The parallel bit test circuit of claim 9, wherein 2N is 128 in a parallel bit test based on 8 bit lines×16.

14. The parallel bit test circuit of claim 13, wherein the semiconductor memory device has a memory array structure of DDR2 type.

15. A parallel bit test circuit for use in a semiconductor memory device, the parallel bit test circuit comprising:
   a first group of comparison and latch units that are configured to be coupled to a first group of memory banks of the semiconductor memory device, the first group of comparison and latch units having N output lines;
   a first bus that includes N first bus lines, wherein each of the output lines of the first group of comparison and latch units is coupled to a respective one of the first bus lines;
   a second group of comparison and latch units that are configured to be coupled to a second group of memory banks of the semiconductor memory device, the second group of comparison and latch units having N output lines;
   a second bus that includes N second bus lines, wherein each of the output lines of the second group of comparison and latch units is coupled to a respective one of the second bus lines; and
   a switching unit that is configured to connect each of the first bus lines to a respective one of the second bus lines in response to a switching control signal.

16. The parallel bit test circuit of claim 15, wherein the switching control signal is applied after a second group of N bits of test result data is output from the second bus to transfer a first group of N bits of test result data from the first bus to the second bus.

17. The parallel bit test circuit of claim 15, wherein the parallel bit test circuit is configured to output 2N bits of test result data per read operation.

18. The parallel bit test circuit of claim 15, wherein the switching unit comprises a plurality of unit switches, and wherein each unit switch is configured to selectively connect a first bus line to a respective second bus line.

* * * * *